United States Patent
Aggarwal et al.

(10) Patent No.: US 7,383,141 B2
(45) Date of Patent: Jun. 3, 2008

(54) FARADAY SYSTEM INTEGRITY DETERMINATION

(75) Inventors: Vinay Aggarwal, Shrewsbury, MA (US); Joseph P. Dzengeleski, Newton, NH (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 11/264,312

(22) Filed: Nov. 1, 2005

(65) Prior Publication Data

US 2007/0100567 A1    May 3, 2007

(51) Int. Cl.
*G01R 27/00* (2006.01)
*G06F 19/00* (2006.01)

(52) U.S. Cl. .............. 702/65; 702/136; 702/183; 702/185; 324/600; 324/605; 324/606

(58) Field of Classification Search .............. 702/65, 702/57, 182, 183, 184; 324/600
See application file for complete search history.

(56) References Cited

U.S. PATENT DOCUMENTS

| | | | | |
|---|---|---|---|---|
| 4,286,194 A | * | 8/1981 | Sherman | 315/209 R |
| 5,103,161 A | * | 4/1992 | Bogaty | 324/71.3 |
| 6,583,421 B2 | * | 6/2003 | Harvey | 250/397 |
| 6,847,036 B1 | * | 1/2005 | Darling et al. | 250/291 |
| 6,937,944 B2 | * | 8/2005 | Furse et al. | 702/58 |
| 2002/0183790 A1 | * | 12/2002 | Sullivan et al. | 607/5 |
| 2003/0033116 A1 | * | 2/2003 | Brcka et al. | 702/182 |
| 2003/0153989 A1 | * | 8/2003 | Scanlan et al. | 700/32 |
| 2004/0100273 A1 | * | 5/2004 | Liney et al. | 324/534 |
| 2006/0088655 A1 | * | 4/2006 | Collins et al. | 427/8 |

OTHER PUBLICATIONS

Liu Jinliang et al., "Effect of Faraday cup impedance on electron beam current of diode", Feb. 1998, High Power Laser and Particle Beams, vol. 10, No. 1, pp. 94-97.*
Translation of Liu Jinliang et al. , "Effects of Faraday Cup Impedance on the Performance of Electron Beam Current of Diodes".*
Barrett et al., "Testing and Calibration of a Faraday Cup and other Intensity Monitors for the External Proton Beam at LAMPF", Nov. 1975, Nuclear Instruments and Methods, vol. 129, No. 2, pp. 441-445.*

* cited by examiner

*Primary Examiner*—Hal D Wachsman

(57) ABSTRACT

A system, method and program product for determining the integrity of a faraday system are disclosed. The invention uses a computer infrastructure to control an automatic determination of a faraday system integrity, when the faraday system is not in operation. The determination is based on the variations on an impedance of the faraday system. An impedance of a faraday system is determined based on the discharge characteristics of a capacitor that discharges through the faraday system.

24 Claims, 3 Drawing Sheets

FARADAY SYSTEM INTEGRITY DETERMINATION

BACKGROUND OF THE INVENTION

1. Technical Field

The present invention relates generally to a faraday system, and more particularly, to a system, method and program product for determining the integrity of a faraday system.

2. Related Art

Ion implantation is a standard technique for introducing conductivity altering impurities into, or doping, semiconductor wafers. A typical ion implantation process uses an energetic ion beam to introduce impurities into semiconductor wafers. As is well known, introducing the impurities at a uniform depth and dose into the wafers is important to ensure that semiconductor devices being formed operate properly.

The depth at which impurities are implanted depends in part upon an incidence angle of an ion beam relative to the crystal structure of the semiconductor. The incidence angle of an ion beam may be determined, inter alia, by measuring an ion beam density using a faraday system including a sampling faraday cup and/or a traveling faraday cup. The dose of an ion beam may be measured by a dose control faraday cup. A faraday system includes a faraday cup and its interconnecting system. As such, it is important to determine and maintain integrity of a faraday system to ensure an accurate measurement of an ion beam using the faraday system.

Efforts have been made to determine the integrity of a faraday system. According to one approach, a faraday cup is manually tested with an external current source manually attached to the faraday system in a specifically designed interconnection of the faraday cup. In another approach, a faraday cup is connected to two wires, and is measured under normal operation through each wire. A ratio between the two measurements by the two wires is used to determine the integrity of the faraday system. In still another approach, a faraday cup is connected to two lines. One of the lines is used to send out a test signal from a test circuitry to the faraday cup under normal operation and the other line is used to read back the signal which passes through a dose measurement path of the faraday cup. The integrity of the faraday system is determined by comparing a value of the read back signal with an expected value.

There are some disadvantages of the conventional approaches of determining faraday system integrity. First, they measure a faraday system with specially created interconnecting wires or cups, which makes the hardware more expensive, less reliable, and makes the measurements not sensitive to changes in the faraday system characteristics. Second, they measure a faraday system manually, which would require an ion implantation machine to be unproductive for longer periods of time while the measurements are being made, and would be susceptible to operator errors.

Based on the above, there is a need to test integrity of a faraday system automatically, without the need to create a special design for either the cup or the interconnecting wires from the cup. There is also a need to determine integrity of a faraday system when the faraday system is not in normal operation.

SUMMARY OF THE INVENTION

A system, method and program product for determining the integrity of a faraday system are disclosed. The invention uses a computer infrastructure to control an automatic determination of a faraday system integrity, when the faraday system is not in operation. The determination is based on the variations in an impedance of the faraday system. An impedance of a faraday system is determined based on the discharge characteristics of a capacitor that discharges through the faraday system.

A first aspect of the invention is directed to a method for determining an integrity of a faraday system used in an ion implantation system, the method comprising steps of: measuring an impedance of the faraday system at a first time and a second different time; and comparing the impedance measured at the first time with the impedance measured at the second different time to determine the integrity of the faraday system.

A second aspect of the invention is directed to a method of generating a system for determining an integrity of a faraday system used in an ion implantation system, the method comprising: providing a computer infrastructure operable to: receive data of an impedance of the faraday system measured at a first time and a second different time; compare the impedance measured at the first time with the impedance measured at the second different time to determine the integrity of the faraday system; and transfer a result of the determination to a user of the system.

A third aspect of the invention is directed to a program product stored on a computer-readable medium, which when executed, enables a computer infrastructure to determine an integrity of a faraday system used in an ion implantation system, the program product comprising computer program code for enabling the computer infrastructure to: obtain data of an impedance of the faraday system measured at a first time and a second different time; and compare the impedance measured at the first time with the impedance measured at the second different time to determine the integrity of the faraday system.

A fourth aspect of the invention is directed to a system for determining an integrity of a faraday system used in an ion implantation system, the system comprising: a measurer for measuring an impedance of the faraday system at a first time and a second different time; and a determinator for comparing the impedance measured at the first time with the impedance measured at the second different time to determine the integrity of the faraday system.

The foregoing and other features of the invention will be apparent from the following more particular description of embodiments of the invention.

BRIEF DESCRIPTION OF THE DRAWINGS

The embodiments of this invention will be described in detail, with reference to the following figures, wherein like designations denote like elements, and wherein.

DETAILED DESCRIPTION

1. Faraday System Impedance Measuring System

Figure 1:
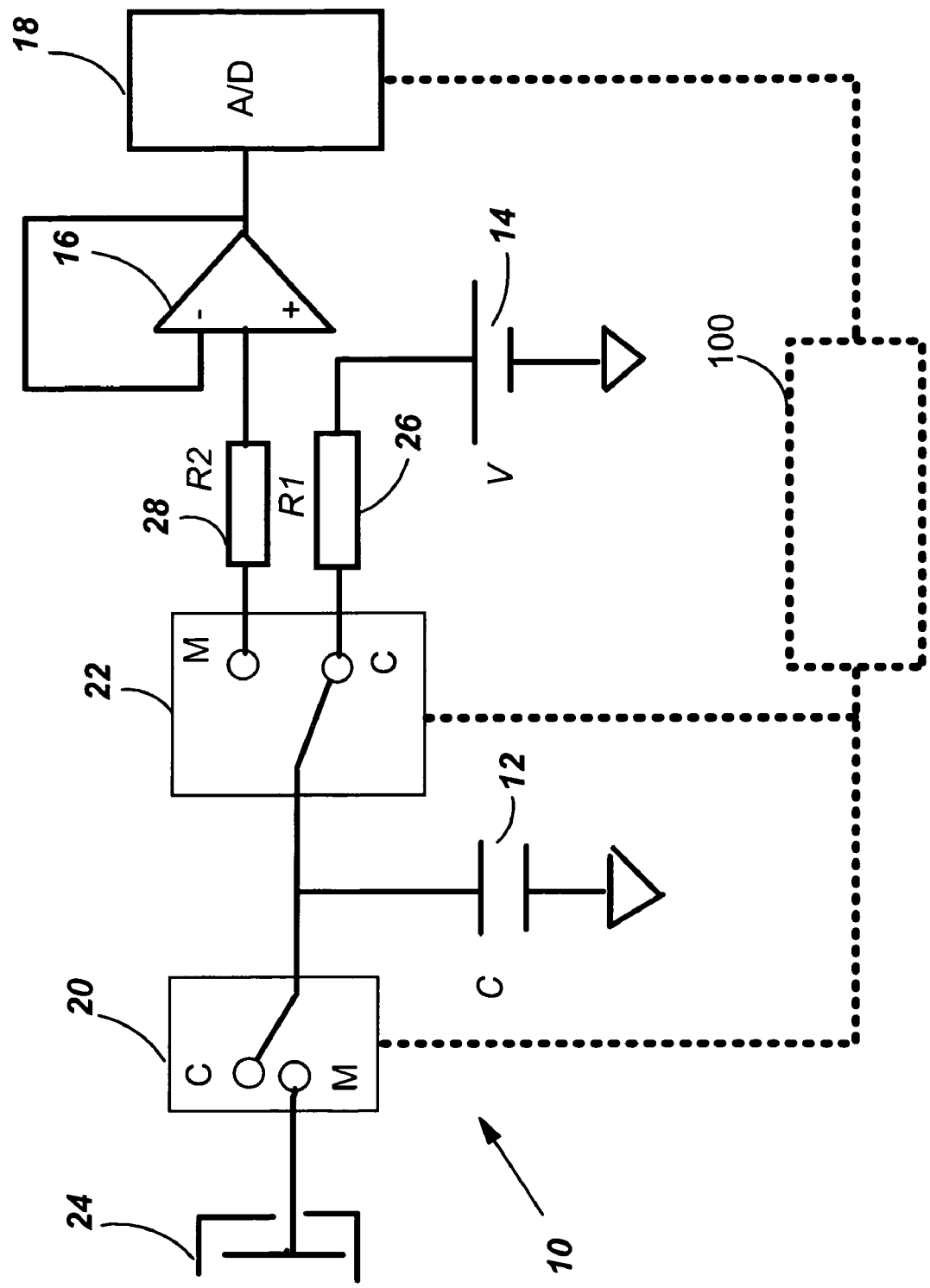
FIG. 1 shows a schematic view of a faraday system impedance measuring system according to one embodiment of the invention.

With reference to the accompanying drawings, FIG. 1 illustrates a schematic view of a faraday system impedance measuring system (measuring system) 10, which may be used in the present invention. Measuring system 10 includes a capacitor 12 with a capacitance C, a DC voltage 14 with a voltage value V, an amplifier 16, an A/D converter 18, switches 20 and 22 and a measurement object, i.e., a faraday system 24 used in an ion implantation system (not shown). Faraday system 24 includes a faraday cup and its interconnecting system (not shown). Switches 20 and 22 each may include a single pole, double throw changeover relay contact which includes a charge position (C) and a measure position (M). Capacitor 12, switch 20 and faraday system 24 are coupled in a manner that when switch 20 switches to the measurement position (M), the positive terminal of capacitor 12 is connected to faraday system 24, and that the charge position (C) of switch 20 is an open end. Capacitor 12, switch 22, DC voltage 14, amplifier 16 and A/D converter 18 are coupled in a manner that when switch 22 switches to the measurement position (M), the positive terminal of capacitor 12 is connected to A/D converter 18 via amplifier 16, and that when switch 22 switches to the charge position (C), the positive terminal of capacitor 12 is connected to DC voltage 14. Additional components of measuring system 10 include resistor 26 with a resistance value R1 and resistor 28 with a resistance value R2. Resistor 26 is positioned between switch 22 and DC voltage 14, Resistor 28 is positioned between switch 22 and the input of amplifier 16. Preferably, resistor 28 needs to have a resistance value R2 substantially larger than an estimated (expected) resistance value of faraday system 24 so that when switches 20 and 22 are both in the measure position (M), there will be substantially no current passing through resistor 28.

Measuring system 10 may be coupled to a computer system 100 (shown in dotted block) in a manner that measuring system 10 components, including switches 20 and 22 and A/D converter 18, are controlled by computer system 100 and an output of A/D converter 18 is communicated to computer system 100.

Measuring system 10 may measure an impedance of faraday system 24 using the following procedure, according to one embodiment of the invention. First, capacitor 12 is fully charged. Specifically, switches 20 and 22 are both actuated to be on the charge position (C), so that capacitor 12 will accumulate charge and a voltage across it will eventually rise to the same value as DC voltage 14, i.e., V. The charging of capacitor 12 can be described by the following formulae, which are well known in the art and are provided for illustration only:

$$V = I*R + Q/C \quad (1)$$

$$Q = C*V*[1 - e^{-t/RC}] \quad (2)$$

$$Q/C = V_c \quad (3)$$

Wherein V is the voltage of DC voltage 14; I is a value of the current; R is the resistance of resistor 26, here R=R1; Q is the value of the charge; C is the capacitance of capacitor 12; t is the charging time; and $V_c$ is the voltage across capacitor 12. According to the above formulae, I will become approximately zero and $V_c$ will become approximately V, when changing time t reaches 4*R*C. Here, according to one embodiment of the invention, a charging time t=10*R*C is allowed to ensure that capacitor 12 is fully charged, i.e., $V_c$ is substantially the same as V.

Second, capacitor 12 is discharged through faraday system 24, when faraday system 24 is not in operation. Specifically, switches 20 and 22 are both switched to the measure position (M) so that capacitor 12 is connected to faraday system 24 and the voltage across capacitor 12 ($V_c$) is available at the input of A/D converter 18 for a measurement. As described above, resistor 28 has a resistance R2 substantially larger than that of faraday system 24, so capacitor 12 does not discharge through resistor 28. An ideal faraday system has zero capacitance and inductance, therefore, the discharging of capacitor 12 can be described by the following formula:

$$V_{(t)} = V_c e^{-t/R_f C} \quad (4)$$

Wherein is $V_{(t)}$ is the voltage of capacitor 12 after time t of discharging; t is the time of discharging; $V_c$ is the voltage of capacitor 12 as fully charged, here $V_c = V$; and $R_f$ is a resistance of faraday system 24. According to formula (4), $R_f$ can be obtained based on a measurement of $V_{(t)}$ by A/D converter 18. According to one embodiment, A/D converter 18 reads the voltage of capacitor 12 ($V_{(t)}$) at equal intervals equal to ⅒ of the expected decay rate of capacitor 12, so that the discharge of capacitor 12 is shown as a waveform. In another embodiment, A/D converter 18 reads the voltage of capacitor 12 at a single selected discharge time after capacitor 12 discharges to obtain a $V_{(t)}$. To ensure that the measurement of A/D converter 18 is substantially accurate, preferably, the selected discharge time t should be less than $3*R_f*C$, so that at time t, $V_{(t)}$ is still of a significant value compared to $V_c$. When capacitor 12 discharges, faraday system 24 preferably needs to be not in operation because if faraday system 24 is in operation, the discharge characteristics of capacitor 12 through faraday system 24 will also be affected by the ion beam density measured by faraday system 24, which is not expected.

In the above description, faraday system 24 is shown as having resistance only, i.e., zero capacitance and inductance, which only applies to an ideal faraday system. In reality, a faraday system may also have capacitance and/or inductance due to the change of electrical characteristics which are detected by this invention, as will be described below. Therefore, an impedance is a more proper indication of faraday system 24 electrical characteristics. It should be understood that an impedance of faraday system 24 can be obtained based on the measured discharge characteristics (including a decay rate) of capacitor 12 attached to faraday system 24. However, the specific formula is not necessary for the understanding of this invention and details of the formula will therefore not be discussed further.

It should be understood that switches 20 and 22 and A/D converter 18 may be automatically controlled by a computer infrastructure, for example, computer system 100. Switches 20 and 22 and A/D converter 18 may also be operated according to the instructions from a computer infrastructure, for example, computer system 100.

As described above, measuring system 10 resolves the problems of previous approaches in that, first, faraday system 24 is measured when it is not in operation. Second, measuring system 10 does not create any additional interconnecting wires from faraday system 24 or any cups. Measuring system 10 does not change the interconnecting wires of faraday system 24, i.e., faraday system 24 is measured at an operation position of interconnection. Third, computer system 100 can control measuring system 10 to measure faraday system 24 automatically.

2. Computer System

Figure 2:
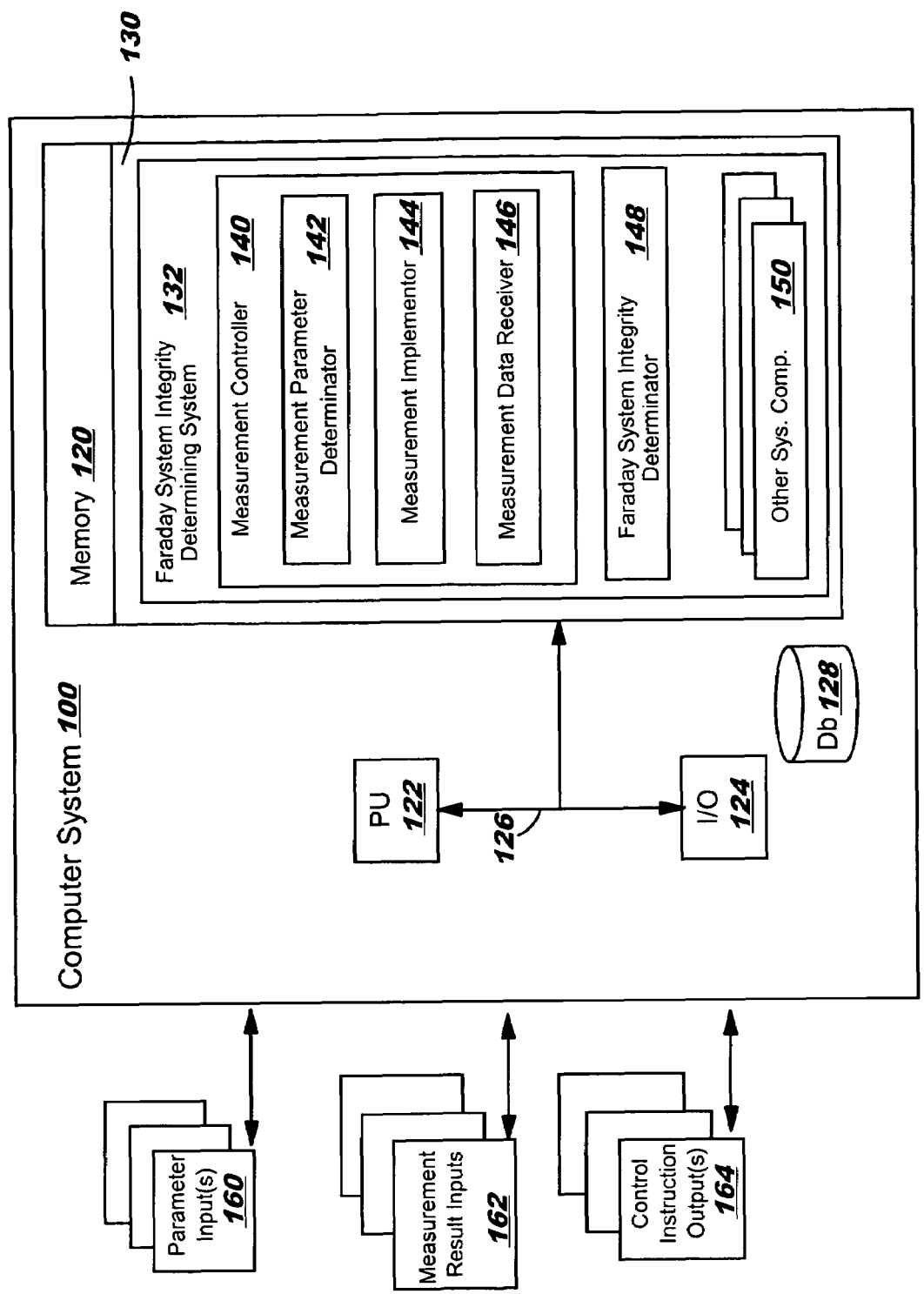
FIG. 2 shows a block diagram of a computer system according to one embodiment of the invention.

Referring to FIG. 2, a block diagram of an illustrative computer system 100 is shown. Computer system 100 includes a computer control system responsive to, inter alia, measuring system 10. In one embodiment, computer system 100 includes a memory 120, a processing unit (PU) 122, input/output devices (I/O) 124 and a bus 126. A database 128 may also be provided for storage of data relative to processing tasks. Memory 120 includes a program product 130 that, when executed by PU 122, comprises various functional capabilities described in further detail below. Memory 120 (and database 128) may comprise any known type of data storage system, including magnetic media, optical media, random access memory (RAM), read only memory (ROM), a data object, etc. Moreover, memory 120 (and database 128) may reside at a single physical location comprising one or more types of data storage, or be distributed across a plurality of physical systems. PU 122 may likewise comprise a single processing unit, or a plurality of processing units distributed across one or more locations. I/O 124 may comprise any known type of input/output device including a network system, modem, keyboard, mouse, scanner, voice recognition system, CRT, printer, disc drives, etc. Additional components, such as cache memory, communication systems, system software, etc., may also be incorporated into computer system 100.

As shown in FIG. 2, program product 130 may include a faraday system integrity determining system 132 that includes a measurement controller 140 including a measurement parameter determinator 142, a measurement implementer 144 and a measurement data receiver 146; a faraday system integrity determinator 148; and other system components 150. Other system components 150 may include any now known parts of a computer system not individually delineated herein, but understood by those skilled in the art.

Referring to both FIGS. 1 and 2, inputs to computer system 100 includes parameter inputs 160 and measurement result inputs 162. Parameter inputs 160 include those from measuring system 10 components including capacitor 12, DC voltage 14, amplifier 16, A/D converter 18 and resistors 26 and 28. Parameter inputs 160 may indicate, among other things, particular states of measuring system 10 including switches 20 and 22, and/or particular components thereof or may indicate user defined input parameters. That is, a parameter input 160 may be any characteristic of measuring system 10, user defined constants or other variables that may affect operation of measuring system 10. Based on the above-described components of measuring system 10 (FIG. 1), parameter inputs 160 may include, for example, capacitor 12 capacitance, resistor 26 resistance and DC voltage 14 voltage.

Measurement result inputs 162 include the measurement results of the measuring system 10, including specifically, A/D converter 18 outputs. Control instructions 164 include the instructions to set up measuring system 10 parameters similar to those received at parameter inputs 160. It should be recognized that the above-described list is meant to be illustrative only.

3. Faraday System Integrity Determining System

Faraday system integrity determining system 132 functions generally to determine the integrity of faraday system 24 with respect to whether it can function properly in the measurement of an ion beam. One embodiment of the operation of faraday system integrity determining system 132 is shown in the flow diagram of FIG. 3. This illustrative embodiment of operation will be described with reference to FIGS. 1 and 2. First, in step S201, measurement parameter determinator 142 of measurement controller 140 determines or obtains the pre-determined/known measurement parameters including, but not limited to, capacitor 12 capacitance, resistors 26 resistance, and DC voltage 14 voltage, amplifier 16 settings and A/D 18 parameters. The values of capacitor 12, DC voltage 14 and resistor 26 preferably need to be set in a manner that facilitates an accurate monitoring by A/D converter 18. For example, A/D converter 18 preferably needs to have enough bits to measure with a required resolution based on a desired accuracy. For example, if the desired accuracy is 0.1%, a resolution of at least $\frac{1}{1024}$ is required and an A/D converter of at least 10 bits needs to be used to achieve this resolution. Because specific settings (parameters) of measuring system 10 components are not necessary for an understanding of the current invention, further details will not be discussed. If the measurement parameters are known, this step may be omitted.

Figure 3:
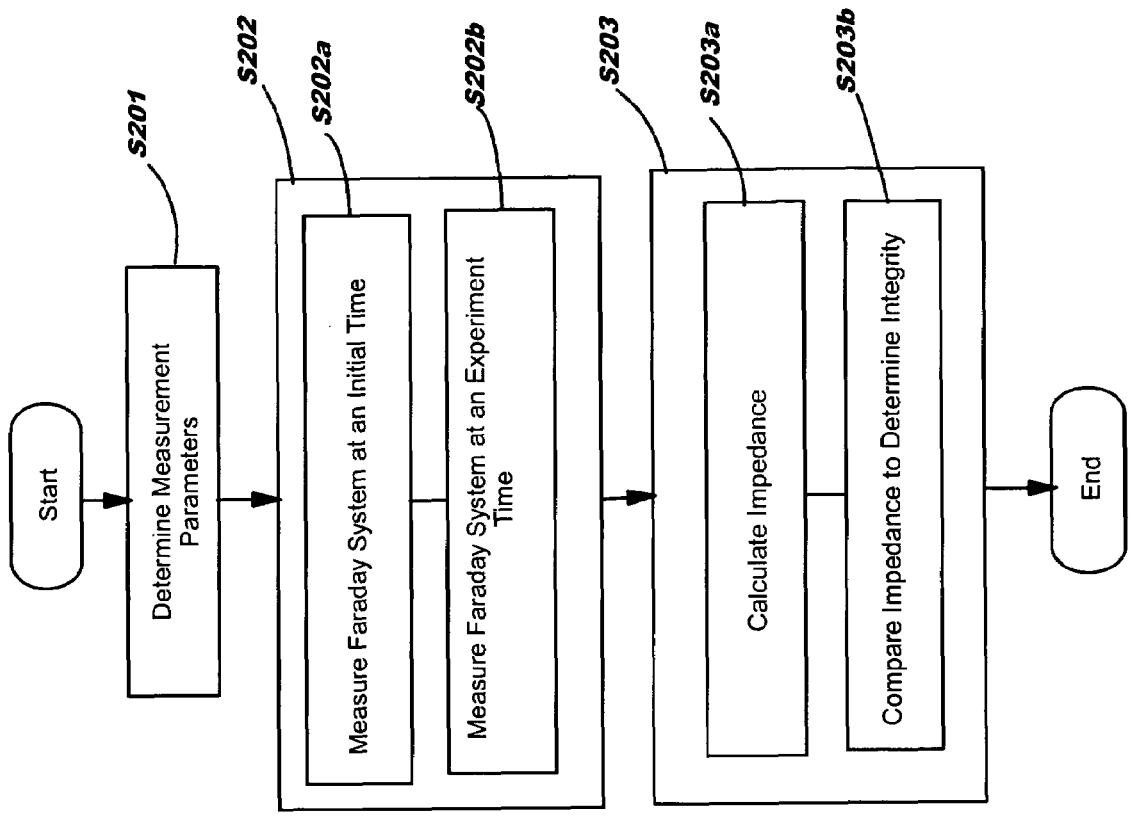
FIG. 3 shows a flow diagram of the operation of a faraday system integrity determining system according to one embodiment of the invention.

Still referring to FIG. 3, next in step S202, measurement implementer 144 controls measuring system 10 to measure faraday system 24 using the procedure described above in section 1 (Faraday system Impedance Measuring System). Preferably, faraday system 24 may be measured at least two times including an initial time and a different experiment time. Specifically, according to one embodiment, in step S202a, faraday system 24 is measured at an initial time. The initial time may be selected to be any time when faraday system 24 is or is assumed to be in satisfactory condition. For example, the initial time may be at least one of the following: a time when the faraday system is new; a time when the faraday system is preventively maintained; a time when the faraday system is adjusted; and a time when the faraday system is repaired. At the times listed above, faraday system 24 is (or is assumed to be) at a satisfactory condition. Therefore, the measurement, specifically, A/D converter 18 readings (outputs), taken at the initial time may be used as a baseline measurement.

Still referring to FIG. 3, and with reference also to FIG. 1, next in step S202b, faraday system 24 is measured at a different experiment time(s) after the initial time. An experiment time can be selected based on, inter alia, a need to test faraday system 24 integrity, a prescribed regular test interval, and after further adjustments or repairs. For example, after a faraday system 24 is repaired, its condition may be measured to determine whether the repair is satisfactory. Further, if the repair is satisfactory, faraday system 24 needs to be measured regularly at a prescribed interval after the repair to determine whether its good condition is maintained.

In both steps S202a and S202b, the measurement results (baseline measurement and experiment time measurement) of measuring system 10, including A/D converter 18 outputs, are transferred to computer system 100 as measurement result inputs 162 and are obtained (or received) by measurement data receiver 146 (FIG. 2).

Still referring to FIG. 3, and with reference also to FIG. 2, next in step S203, faraday system integrity determinator 148 determines the integrity of faraday system 24 (FIG. 1) based on the measurement data obtained by measurement data receiver 146. Specifically, according to one embodiment, determinator 148, in step S203a, calculates an impedance of faraday system 24 based on each measurement of A/D converter 18 (FIG. 1). An impedance calculated based on a baseline measurement is a baseline impedance. An impedance calculated based on an experiment time measurement is an experiment impedance.

Next in step S203b, determinator 148 compares the experiment impedance to the baseline impedance calculated in step S203a to determine the integrity of faraday system 24 (FIG. 1). A preset threshold may be used to define an acceptable range of the difference between an experiment impedance and a baseline impedance. If a difference between an experiment impedance and a baseline impedance is beyond the threshold, faraday system 24 (FIG. 1) is considered in an inferior condition and needs proper maintenance/repair. If a difference between an experiment impedance and a baseline impedance is within the threshold, faraday system 24 (FIG. 1) is considered in satisfactory condition.

Alternatively, referring to FIGS. 2 and 3, according to another embodiment, step S203a may be skipped. Determinator 148 may determine the integrity of faraday system 24 based only on the measurements of A/D converter 18 (FIG. 1). As described above, if the resistance, capacitance and inductance of faraday system 24 change, a decay rate of capacitor 12 measured at an experiment time will diverge from the baseline measurement, and determinator 148 may determine the integrity of faraday system 24 (FIG. 1) accordingly.

According to still another embodiment, faraday system 24 (FIG. 1) is measured at an experiment time including at least one of a time when faraday system 24 is at an operating temperature (hot characteristic), for example, when faraday system 24 has just been heated during normal operation, and a time when faraday system 24 is at a non-operating temperature (cold characteristic), for example, when it is under maintenance. Either the hot characteristic or the cold characteristic can be compared with the baseline measurement to determine the integrity of faraday system 24 (FIG. 1). In addition, the hot characteristic and the cold characteristic can be compared with each other to determine the integrity of faraday system 24. In particular, for a faraday system 24 in satisfactory condition, the hot characteristic and the cold characteristic should be approximately the same.

4. Conclusion

In the previous discussion, it will be understood that the method steps discussed are performed by a processor, such as PU 122 of computer system 100, executing instructions of program product 130 stored in a memory. It is understood that the various devices, modules, mechanisms and systems described herein may be realized in hardware, software, or a combination of hardware and software, and may be compartmentalized other than as shown. They may be implemented by any type of computer system or other apparatus adapted for carrying out the methods described herein. A typical combination of hardware and software could be a general-purpose computer system with a computer program that, when loaded and executed, controls the computer system such that it carries out the methods described herein. Alternatively, a specific use computer, containing specialized hardware for carrying out one or more of the functional tasks of the invention could be utilized. The present invention can also be embedded in a computer program product, which comprises all the features enabling the implementation of the methods and functions described herein, and which—when loaded in a computer system—is able to carry out these methods and functions. Computer program, software program, program, program product, or software, in the present context mean any expression, in any language, code or notation, of a set of instructions intended to cause a system having an information processing capability to perform a particular function either directly or after the following: (a) conversion to another language, code or notation; and/or (b) reproduction in a different material form.

While shown and described herein as a method, system and computer product for determining faraday system integrity, it is understood that the invention further provides various alternative embodiments. For example, in another embodiment, the invention provides a business method that performs the process steps of the invention on a subscription, advertising, and/or fee basis. That is, a service provider, such as an Internet Service Provider, could offer to determine ion beam parallelism and direction integrity, as described above. In this case, the service provider can create, maintain, and support, etc., a computer infrastructure, such as a computer system 100 (FIG. 2), that performs the process steps of the invention for one or more customers. In return, the service provider can receive payment from the customer(s) under a subscription and/or fee agreement and/or the service provider can receive payment from the sale of advertising space to one or more third parties.

In still another embodiment, the invention provides a method of generating a system for determining faraday system integrity. In this case, a computer infrastructure, such as computer system 100 (FIG. 2), can be obtained (e.g., created, maintained, having made available to, etc.) and one or more systems for performing the process steps of the invention can be obtained (e.g., created, purchased, used, modified, etc.) and deployed to the computer infrastructure. To this extent, the deployment of each system can comprise one or more of (1) installing program code on a computing device, such as computer system 100 (FIG. 2), from a computer-readable medium; (2) adding one or more computing devices to the computer infrastructure; and (3) incorporating and/or modifying one or more existing systems of the computer infrastructure, to enable the computer infrastructure to perform the process steps of the invention. According to this embodiment, measuring of faraday system 24 can be performed remotely from the computer infrastructure including computer system 100 (FIG. 2). Specifically, measurement data is received by computer system 100, calculated therein, and determination results are transferred back to a remote user, e.g., at the site of the measurement.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. A method for determining an integrity of a faraday system, the method comprising steps of:
    measuring an impedance of the faraday system comprising a faraday cup at a first time and a second different time;
    comparing the impedance measured at the first time with the impedance measured at the second different time to determine the integrity of the faraday system; and
    outputting a result of the determination, wherein the second different time includes at least one of:
        a time when the faraday system is at an operating temperature; and
        a time when the faraday system is at a non-operating temperature.

2. The method of claim 1, wherein the first time is selected based on at least one of the following:
- a time when the faraday system is new;
- a time when the faraday system is preventively maintained;
- a time when the faraday system is adjusted; and
- a time when the faraday system is repaired.

3. The method of claim 2, wherein the second different time is later than the first time by a prescribed interval.

4. The method of claim 1, wherein the measuring step includes measuring a decay rate of a capacitor attached to the faraday system.

5. The method of claim 4, wherein the decay rate measuring includes one of:
- measuring a voltage of the capacitor at equal intervals after the capacitor discharges to characterize a discharge waveform of the capacitor; and
- measuring a voltage of the capacitor at a single time after the capacitor discharges.

6. The method of claim 1, wherein the measuring step is performed with the faraday system at an operation position.

7. A method for determining an integrity of a faraday system, the method comprising: providing a computer infrastructure having instructions stored on a computer-readable medium, which when executed are operable to:
- receive data of an impedance of the faraday system comprising a faraday cup measured at a first time and a second different time;
- compare the impedance measured at the first time with the impedance measured at the second different time to determine the integrity of the faraday system; and
- transfer a result of the determination to a user, wherein the second different time includes at least one of:
  - a time when the faraday system is at an operating temperature; and
  - a time when the faraday system is at a non-operating temperature.

8. The method of claim 7, wherein the first time is selected based on at least one of the following:
- a time when the faraday system is new;
- a time when the faraday system is preventively maintained;
- a time when the faraday system is adjusted; and
- a time when the faraday system is repaired.

9. The method of claim 8, wherein the second different time is later than the first time by a prescribed interval.

10. The method of claim 7, wherein the computer infrastructure is further operable to obtain data of a measurement of a decay rate of a capacitor attached to the faraday system.

11. The method of claim 10, wherein the decay rate measurement includes one of:
- a measurement of a voltage of the capacitor at equal intervals after the capacitor discharges to characterize a discharge waveform of the capacitor; and
- a measurement of a voltage of the capacitor at a single time after the capacitor discharges.

12. The method of claim 7, wherein the impedance is measured with the faraday system at an operation position.

13. A computer program product stored on a computer-readable medium, which when executed, is operable to:
- obtain data of an impedance of a faraday system comprising a faraday cup measured at a first time and a second different time;
- compare the impedance measured at the first time with the impedance measured at the second different time to determine an integrity of the faraday system; and
- output a result of the determination, wherein the second different time includes at least one of:
  - a time when the faraday system is at an operating temperature; and
  - a time when the faraday system is at a non-operating temperature.

14. The computer program product of claim 13, wherein the first time is selected based on at least one of the following:
- a time when the faraday system is new;
- a time when the faraday system is preventively maintained;
- a time when the faraday system is adjusted; and
- a time when the faraday system is repaired.

15. The computer program product of claim 14, wherein the second different time is later than the first time by a prescribed interval.

16. The computer program product of claim 13, which when executed is further operable to obtain a measurement of a decay rate of a capacitor attached to the faraday system.

17. The computer program product of claim 16, wherein the decay rate measurement includes one of:
- a measurement of a voltage of the capacitor at equal intervals after the capacitor discharges to characterize a discharge waveform of the capacitor; and
- a measurement of a voltage of the capacitor at a single time after the capacitor discharges.

18. The computer program product of claim 13, wherein the impedance is measured with the faraday system at an operation position.

19. A system for determining an integrity of a faraday system, the system comprising:
- a measurer for measuring an impedance of the faraday system comprising a faraday cup at a first time and a second different time; and
- a determinator for comparing the impedance measured at the first time with the impedance measured at the second different time to determine the integrity of the faraday system, wherein the second different time includes at least one of:
  - a time when the faraday system is at an operating temperature; and
  - a time when the faraday system is at a non-operating temperature.

20. The system of claim 19, wherein the first time is selected based on at least one of the following:
- a time when the faraday system is new;
- a time when the faraday system is preventively maintained;
- a time when the faraday system is adjusted; and
- a time when the faraday system is repaired.

21. The system of claim 20, wherein the second different time is later than the first time by a prescribed interval.

22. The system of claim 19, wherein the measurer measures a decay rate of a capacitor attached to the faraday system.

23. The system of claim 22, wherein the decay rate measuring includes one of:
- measuring a voltage of the capacitor at equal intervals after the capacitor discharges to characterize a discharge waveform of the capacitor; and
- measuring a voltage of the capacitor at a single time after the capacitor discharges.

24. The system of claim 19, wherein the measurer measures the impedance of the faraday system with the faraday system at an operation position.

* * * * *